United States Patent [19]

Yu et al.

[11] Patent Number: 5,240,552
[45] Date of Patent: Aug. 31, 1993

[54] CHEMICAL MECHANICAL PLANARIZATION (CMP) OF A SEMICONDUCTOR WAFER USING ACOUSTICAL WAVES FOR IN-SITU END POINT DETECTION

[75] Inventors: Chris C. Yu; Gurtej S. Sandhu, both of Boise, Id.

[73] Assignee: Micron Technology, Inc., Boise, Id.

[21] Appl. No.: 806,096

[22] Filed: Dec. 11, 1991

[51] Int. Cl.$^5$ .............................. H01L 21/00
[52] U.S. Cl. .................... 156/636; 156/626; 437/225
[58] Field of Search ............... 156/636; 437/225, 626

[56] References Cited

U.S. PATENT DOCUMENTS

| | | | |
|---|---|---|---|
| 3,841,031 | 10/1974 | Walsh | 51/283 |
| 4,193,226 | 3/1980 | Gill, Jr. et al. | 51/124 |
| 4,811,522 | 3/1989 | Gill, Jr. | 51/131.1 |
| 5,036,015 | 7/1991 | Sandhu et al. | 437/8 |

FOREIGN PATENT DOCUMENTS 1532856 12/1989 U.S.S.R. .

OTHER PUBLICATIONS

B. Davari et al., "Nondestructive Elvaluation of Generation ... ", *International Electron Devices Meeting* 1983, Tech. Dig. Dec. 5-7, 1983, pp. 678-681.

W. Mechev et al, "Holographic Interferometric Monitoring ... ", *Instruments and Exp. Tech.*, vol. 25, No. 3, pt. 2, May-Jun. 1982, pp. 771-774.

S. Bhardway; B. T. Khuri-Yakub and K. C. Saraswat, Extended Abstract No. 790, "Acoustic Techniques for Thin Film Thickness Measurement in Semiconductor Processing" pp. 1164-1165, 1991 Fall Electrochemical Society Meeting (1991).

*Primary Examiner*—Brian E. Hearn
*Assistant Examiner*—Laura M. Holtzman
*Attorney, Agent, or Firm*—Stephen A. Gratton

[57] ABSTRACT

A method and apparatus for chemically mechanically planarizing (CMP) a semiconductor wafer includes directing acoustic waves at the wafer and receiving reflected acoustic waves from the wafer during the (CMP) process. By analyzing the acoustic waves and reflected acoustic waves a thickness of the wafer can be determined and an endpoint and thickness of films formed on the wafer can be monitored in real time during the (CMP) process. The process parameters of the (CMP) process can then be adjusted as required to improve the uniformity of the process.

10 Claims, 4 Drawing Sheets $X = V(T1-T2)$

CHEMICAL MECHANICAL PLANARIZATION (CMP) OF A SEMICONDUCTOR WAFER USING ACOUSTICAL WAVES FOR IN-SITU END POINT DETECTION

TECHNICAL FIELD

This invention relates to semiconductor manufacture and, mor particularly, to a novel method and apparatus for controlling a chemical mechanical planarization (CMP) process in real time by determining a thickness of a semiconductor wafer using acoustical waves.

BACKGROUND OF THE INVENTION

In the fabrication of integrated circuits (IC's), it is often necessary to polish a side of a part such as a thin flat wafer of a semiconductor material. This polishing process is often referred to as mechanical planarization or chemical mechanical planarization (CMP) and is utilized to improve the quality and reliability of semiconductor devices. The (CMP) process is usually performed during the formation of various devices and integrated circuits on the wafer.

In general, the chemical mechanical planarization (CMP) process involves holding a thin flat wafer of semiconductor material against a rotating wetted polishing surface under a controlled downward pressure.

Apparatus for polishing thin flat semiconductor wafers are well known in art. U.S. Pat. Nos. 4,193,226 and 4,811,522 to Gill, Jr. and U.S. Pat. No. 3,841,031 to Walsh, for instance, disclose such apparatus.

FIGS. 1-2 illustrate the affect of the chemical mechanical planarization (CMP) process on a semiconductor wafer. As shown in FIG. 1, a semiconductor wafer 10 includes a substrate 12 on which a plurality of IC devices 14 have been formed. The wafer substrate 12 is formed of a single crystal silicon material. The IC devices 14 are typically formed by patterning regions and layers on the substrate 12. A chemical mechanical planarization (CMP) process may be utilized, for instance, to remove and planarize a portion of a layer such as an oxide coating 16.

As an example, and as shown in FIG. 2, it may be necessary to remove the oxide coating 16 to the level of the IC devices 14 to planarize the oxide coating and form insulating spacers between the IC devices 14. This can be accomplished by a chemical mechanical planarization (CMP) process. Alternately it may be necessary to remove and planarize some feature or structure formed on the substrate 12 to the surface of the substrate 12. Other semiconductor manufacturing processes such as polishing, roughening or thinning the wafer may also involve a chemical mechanical planarization (CMP) process.

A particular problem encountered in the use of such chemical mechanical planarization apparatus is in the control of the various process parameters during a chemical mechanical process to achieve the desired wafer characteristics. It may be desirable for instance, to achieve a particular surface smoothness or roughness or to planarize the wafer to a desired film thickness (form example, a desired thickness of layer 16 in FIG. 1.

In the past, the surface characteristics and planar endpoint of the planarized wafer surface has been detected by mechanically removing the semiconductor wafer from the planarization apparatus and physically examining the semiconductor wafer by techniques which ascertain dimensional and planar characteristics. In these applications commercial instruments such as surface profilometers, ellipsometers, or quartz crystal oscillators are used. If the semiconductor wafer does not meet specifications, it must be loaded back into the planarization apparatus and planarized again. This is a time consuming and labor intensive procedure. In addition, an excess of material may have been removed from the semiconductor wafer rendering the part as unusable. The process yield of the semiconductor manufacturing process may thus be adversely affected.

One prior art patent, U.S. Pat. No. 5,036,015, to Sandhu et al, which is assigned to the assignee of the present application, discloses an in-situ process for detecting a planar endpoint during the chemical mechanical planarization (CMP) process. In this process a change of friction between the wafer surface and polishing platen are sensed by measuring a load change on the drive motors for the chemical mechanical planarization apparatus. A change of friction may occur for example, at the planar endpoint which separates different film layers on a wafer. While this process is effective for determining a planar endpoint on a wafer, it depends on the existence of two dissimilar layers of material on the wafer.

The present invention is directed to a novel method and apparatus of in-situ end point detection performed during a semiconductor chemical mechanical planarization (CMP) process in real time using acoustical waves.

SUMMARY OF THE INVENTION

In accordance with the present invention, a novel method and apparatus for chemical mechanical planarization (CMP) of a semiconductor wafer using acoustical waves for in-situ end point detection is provided. In general, the method and apparatus of the invention directs an acoustic wave into a wafer being planarized utilizing a means for generating acoustic waves. The round trip time and amplitude of the reflected wave is then detected by an acoustical sensing means. Since the round trip time and the amplitude of the reflected acoustical wave is a function of the thickness and mechanical properties of the material within which it travels, the thickness of the wafer and the end point of a film being planarized can be continuously monitored across the wafer surface during the (CMP) process.

As an example, during planarization of multi-layered stacked films, the transition from one film to another during planarization and the location of different films on the wafer surface can be monitored in real time because the speed of sound and acoustical absorption will vary with the different film materials. This information can then be used to modify the (CMP) parameters (such as time, temperature, rotational speeds, wafer backside pressure, down force, polishing slurry flow, etc.) to improve the (CMP) process in situ. As another example, the thickness of a film can be continuously monitored in real time to achieve a desired planar end point of the film. Moreover by detecting a film thickness at several sites a film thickness map can be generated and the uniformity across the wafer surface of the film being planarized can be monitored. The uniformity of the (CMP) process can thus be controlled.

In an illustrative embodiment, apparatus for carrying out the method of the invention includes: a wafer carrier and a rotating polishing platen for chemically mechanically planarizing (CMP) the semiconductor wafer, acoustic wave generating means for directing acoustic waves at the wafer during planarization, acoustic wave receiving means for receiving acoustic waves reflected from the wafer, and control means for analyzing the acoustic waves and for controlling the parameters of the (CMP) in response to analysis of the reflected waves. Piezoelectric thin films can be mounted within the wafer carrier and utilized for generating an acoustic wave (i.e. driver) and for receiving the acoustic waves (i.e. detector).

Other objects, advantages, and capabilities of the present invention will become more apparent as the description proceeds.

DESCRIPTION OF PREFERRED EMBODIMENTS

Figure 1:
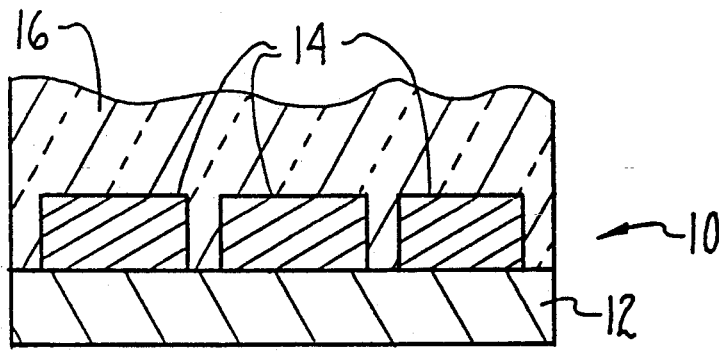
FIG. 1 is an enlarged side elevation view of a portion of a semiconductor wafer prior to chemical mechanical planarization (CMP)
Figure 2:
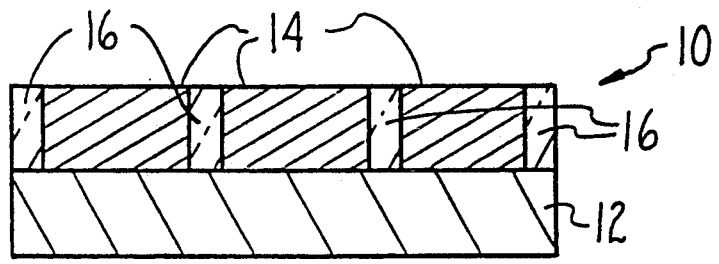
FIG. 2 is an enlarged side elevation view of a portion of a semiconductor wafer after chemical mechanical planarization (CMP)
Figure 3:
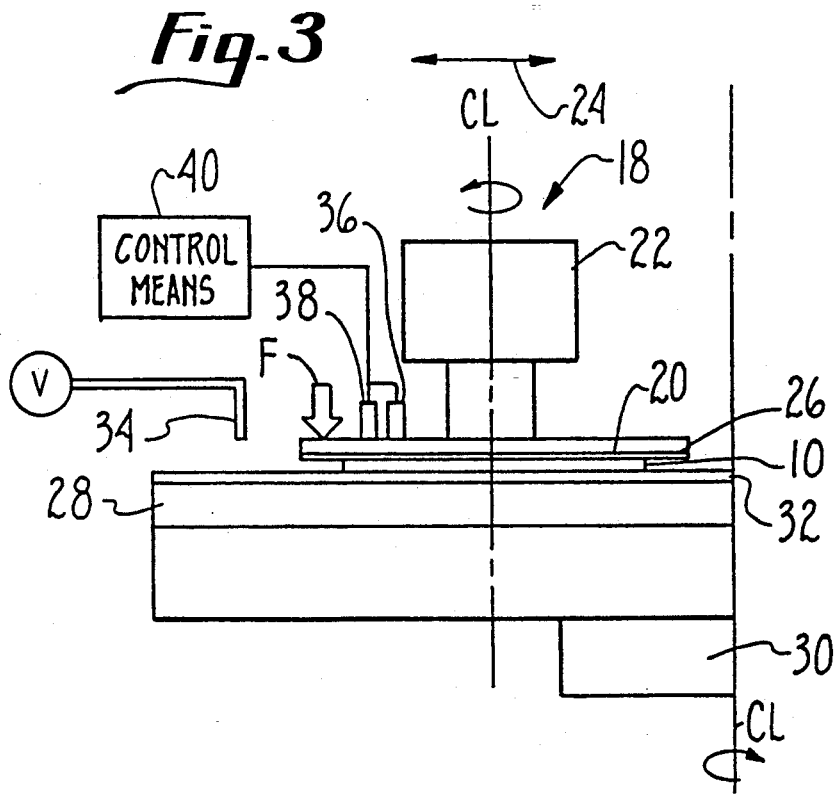
FIG. 3 is a schematic view of a chemical mechanical planarization (CMP) apparatus for use in accordance with the method of the invention.

Referring now to FIG. 3 an apparatus suitable for performing a chemical mechanical planarization (CMP) process in accordance with the invention is shown and generally designated as 18. The chemical mechanical planarization (CMP) apparatus 18 includes a wafer carrier 20 for holding a semiconductor wafer 10. The wafer carrier 20 is mounted for continuous rotation by a drive motor 22. In addition the wafer carrier 20 is mounted for transverse movement as indicated by double headed arrow 24. The wafer carrier 20 may include a wafer carrier pad 26 formed of a soft material for contacting a backside of the wafer 10. Additionally, the wafer carrier 20 may include a vacuum holding means (not shown) for holding the wafer 10 in the wafer carrier 20 during the chemical mechanical planarization (CMP) process. The wafer carrier 20 is adapted to exert a downward pressure or force F on the wafer 10. The (CMP) apparatus 18 also includes a polishing platen 28 mounted for rotation by a drive motor 30. A polishing pad 32 formed of a material such as blown polyurethane is mounted to the polishing platen 28. The polishing platen 28 is relatively large in comparison to the wafer 10 so that during the (CMP) process the wafer 10 may be moved across the surface of the polishing pad 32 by the wafer carrier 20. A polishing slurry containing an abrasive fluid, such as silica or alumina abrasive particles suspended in either a basic or an acidic solution, is deposited through a conduit 34 onto the surface of the polishing pad 32.

The (CMP) apparatus 18 also includes an acoustic wave generating means in the form of a transducer (driver) 36, an acoustic wave receiving means in the form of a receiver (detector) 38, and a control means 40 for receiving and analyzing data from the transducer 36 and receiver 38 and for generating signals for controlling the operational parameters of the (CMP) apparatus 18 in response to this data.

In general the transducer 36 generates acoustic waves that are directed at the wafer 10. The receiver 38 receives acoustic waves reflected from the wafer 10. These reflected waves can then be analyzed to determine the thickness of the wafer and the thickness and end points of different films formed on the wafer 10 and to control the operational parameters of the (CMP) apparatus 18 accordingly. The uniformity of the (CMP) process can thus be increased. These operational parameters may include the time, rotational speeds, wafer backside pressure down force, and polishing slurry composition.

Figure 4:
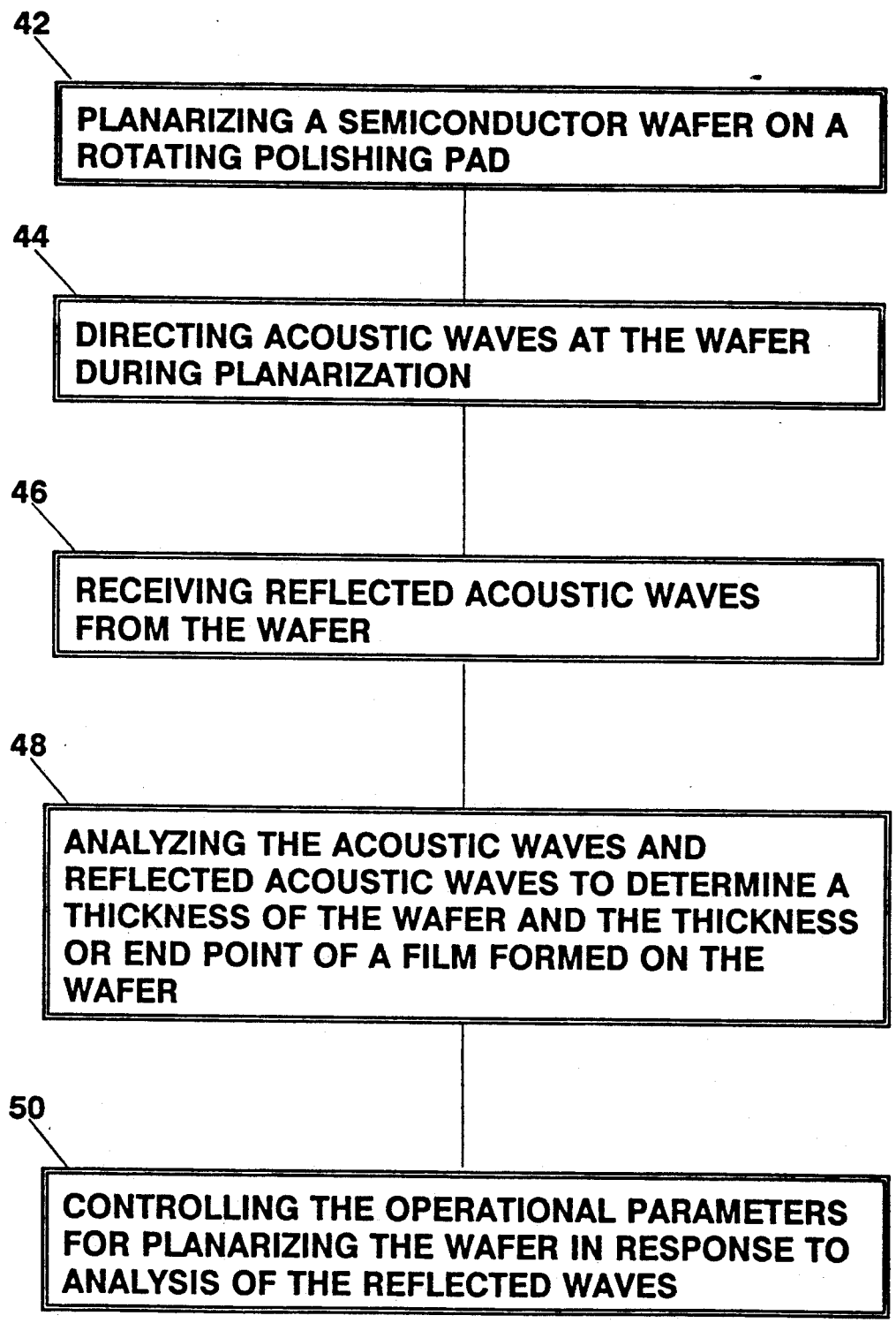
FIG. 4 is a block diagram of a method of chemical mechanical planarization (CMP) in accordance with the invention.

The method of the invention, then, and with reference to FIG. 4, includes the steps of:

planarizing a semiconductor wafer on a rotating polishing pad, step 42;

directing acoustic waves at the wafer during planarization, step 44;

receiving reflected acoustic waves from the wafer, step 46;

analyzing the acoustic waves and reflected acoustic waves to determine a thickness of the wafer and a thickness or end point of a film formed on the wafer, step 48; and controlling the operational parameters for planarizing the semiconductor wafer in response to analysis of the reflected waves, step 50.

Figure 5:
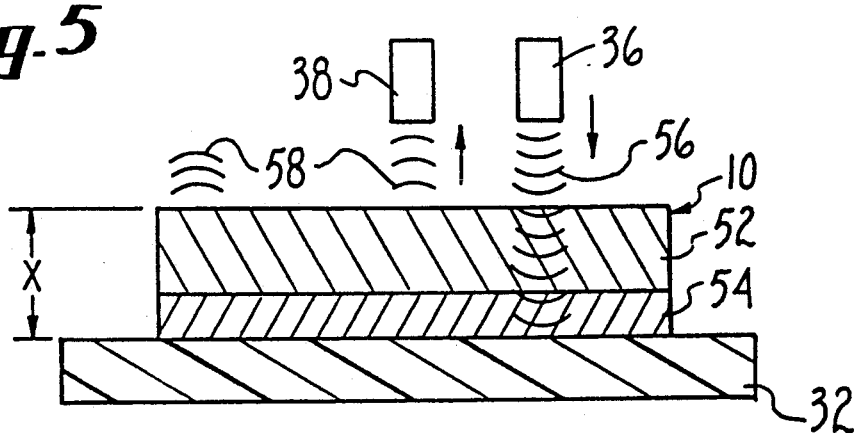
FIG. 5 is a schematic diagram of a portion of (CMP) apparatus constructed in accordance with the invention.

Referring now to FIG. 5 the method of the invention is illustrated in schematic form. As shown the wafer 10 includes a substrate 52 and a film 54 deposited or otherwise formed during the semiconductor manufacturing process on the substrate 52. As an example, the film 54 may be an insulator such as an oxide or a conductor such as a metallic film or polysilicon. In general the speed of an acoustic wave 56 directed at the backside of the wafer 10 through the substrate 52 and through the film 54 will depend on the characteristics of the substrate 52 and film 54. The substrate 52 is typically of a single crystal silicon material having a thickness and characteristics closely controlled by previous manufacturing operations. During (CMP) it may be desirable to planarize the film 54 to a certain thickness or to a certain planar endpoint. The planar endpoint may be at a top surface of the substrate 52 or at a planar endpoint of different films formed on the substrate 52. It may also be desirable to control the uniformity of the film across the surface of the wafer 10.

The transducer 36 generates acoustic waves 56 that are directed at the wafer 10. With the transducer 36 mounted upon or adjacent to the wafer carrier 20 as shown in FIG. 3, the acoustic waves 56 are directed at a backside of the wafer 10. Alternately the acoustic waves 56 may be directed at a front side of the wafer 10. The receiver 38 detects the arrival of reflected acoustic waves 58 from the wafer 10. By analyzing the acoustic waves 56 and reflected acoustic waves 58, the thickness of the wafer 10 and the film 54 can be determined.

In general, the thickness of the wafer 10 including film 54 and substrate 52 can be determined from the round trip time (T1-T2), (i.e. the time interval between the launch of an acoustical wave 56 by the transducer 36 and the reception of the reflected wave 58 by the receiver 38) and by the speed of the acoustic waves through the substrate 52 and film 54. This relationship can be expressed by the formula $x = V(T1-T2)/2$. In this formula V equals the velocity of the acoustic waves 56 (i.e. acoustic velocity). Since the speed of sound is different through the substrate 52 than through the film 54, a weighted average can be used for the value of V. This may be given for a stack of n layers by the formula $$V = \sum_{i=1}^{n} \frac{V_i l_i}{\sum_{j=1}^{n} l_j}.$$

In this formula 1 is equal to the thickness of the different layers of material (i.e. substrate 52 and film 54). For two layers, as with the present example, this weighted average can be given by $$V = \frac{V_1 l_1 + V_2 l_2}{l_1 + l_2}$$

where $l_1$ = the substrate 52 and $l_2$ = the film 54.

The round trip time of the wave in turn is given by T1-T2, where T1 is the launch time by the transducer 36 and T2 is the reception time by the receiver 38.

Figure 6A:
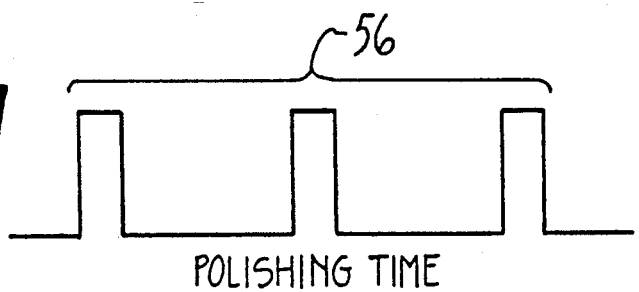
FIG. 6A is a graph illustrating an amplitude, duration and frequency of incident acoustical waves directed at a wafer in accordance with the method of the invention.
Figure 6B:
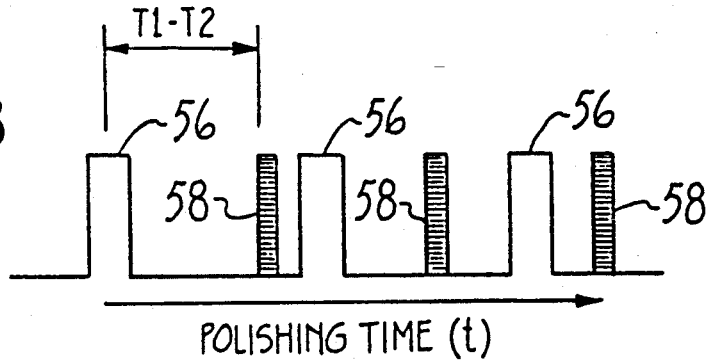
FIG. 6B is a graph illustrating an amplitude, duration and frequency of incident acoustical waves in comparison to an amplitude duration and frequency of acoustical waves reflected from the wafer in accordance with the method of the invention.
Figure 6C:
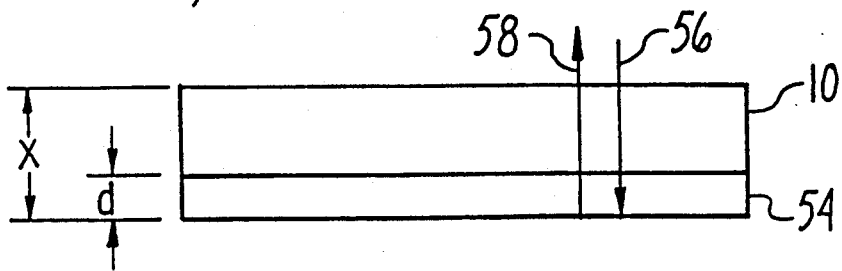
FIG. 6C is a schematic diagram of a semiconductor wafer illustrating the determination of a thickness of a film of the wafer in accordance with the method of the invention.

FIGS. 6A, 6B and 6C illustrate this relationship graphically. As shown in FIG. 6A, acoustic waves 56 are generated by the transducer 36 continuously during planarization or polishing of the wafer 10. These incident acoustical 56 waves are of a known frequency, duration and amplitude. As shown in FIG. 6B, the reflected acoustical waves 58 are detected by the receiver 38 after the round trip time period T1-T2. The frequency, duration and amplitude of the reflected waves 58 can also be analyzed and compared to established data. As shown in FIG. 6C the thickness "x" can be determined by the formula $x = V(T1-T2)/2$ where V equals the weighted average acoustic velocity in the film 54 and substrate 52.

Using this information a polish rate can be determined by the formula:

$$\text{polish rate} = \frac{x(t_2) - x(t_1)}{t_2 - t_1}$$

where t=the polishing time. The thickness of the film removed in a polishing time of $(t_2-t_1) = x(t_2) - x(t_1)$.

Figure 9A:
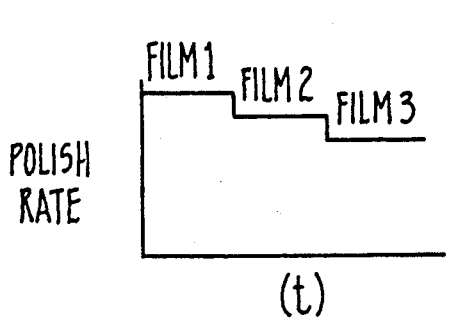
FIGS. 9A and 9B are graphs of polish rate versus time for different films.
Figure 9B:
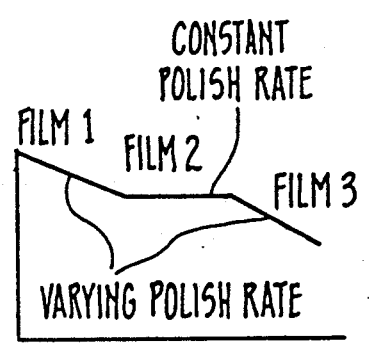

FIG. 9A and 9B are graphic examples showing data for monitoring the polishing rate of different films in accordance with the invention.

As an example, the speed of sound through an oxide is on the order of about 5000 meters/second. Therefore for planarizing and removing an oxide layer of about 0.5 um, the round trip time is on the order of about 0.2 nanoseconds. This is well within the detection limit of commercially available transducers and detectors. The endpoint of the oxide layer can thus be detected in real time during the (CMP) process. In addition an amplitude as well as a round trip time (T1-T2) of the acoustic waves 56 and reflected waves 58 will change after a film has been completely removed and, a different film layer is contacted. An end point that corresponds to the interface of a different film on multi layers of stacked films can thus be detected. In addition, the planarization of a film 54 across the wafer can be measured in real time during the (CMP) process by measuring a film thickness at several sites on the wafer. The planarity of the film 54 can thus be detected during the (CMP) process.

With this information the process parameters for the (CMP) process can be varied accordingly. As such a visual output can be provided, such as on an operator monitor, and the process parameters can be manually or automatically adjusted utilizing appropriate control means 40 for the (CMP) apparatus 18.

Figure 7:
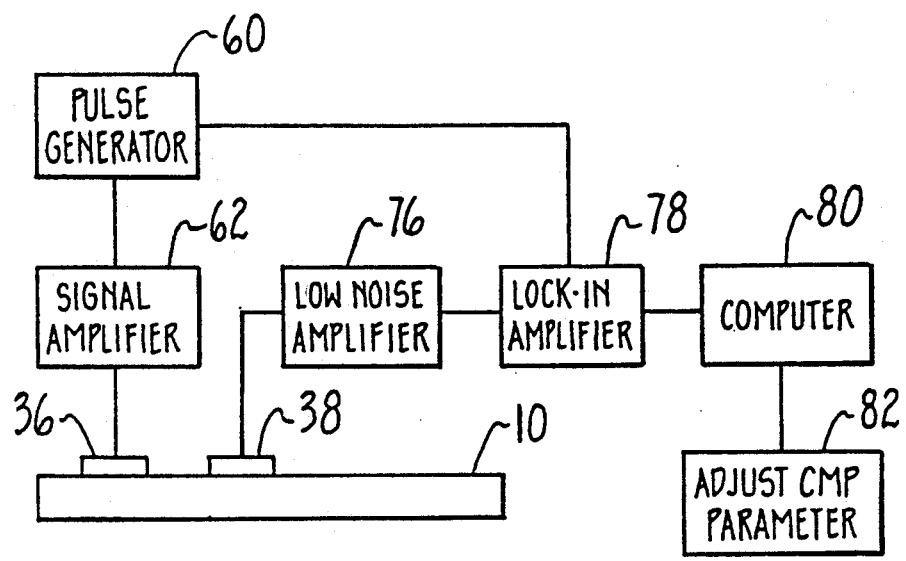
FIG. 7 is a schematic block diagram of control apparatus for directing, receiving and analyzing acoustic waves in accordance with the invention in order to control a (CMP) process.
Figure 8:
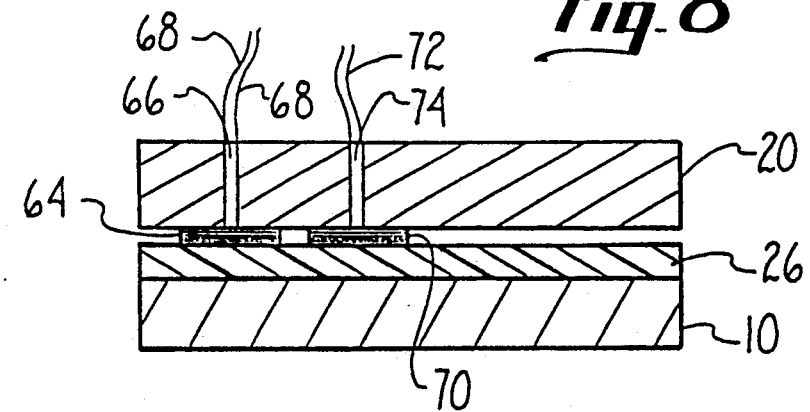
FIG. 8 is an enlarged schematic view of apparatus for directing and receiving acoustic waves at the wafer.

With reference to FIGS. 7 and 8, a means for generating and receiving acoustic waves is shown in more detail. It is known that a piezoelectric transducer is capable of converting an electric voltage applied to it into a mechanical strain resulting in an acoustical wave. A piezoelectric transducer is also capable of converting an acoustical wave (strain) into an electrical voltage (or electric charge).

As an example, the transducer 36 of the present (CMP) apparatus 18, may include a piezoelectric thin film that acts as a driver. When a voltage pulse is applied to the transducer 36, the voltage is converted by the piezoelectric thin film into an acoustical wave. The receiver 38 can similarly include a piezoelectric thin film that acts as a detector for converting the reflected acoustic wave back into a voltage. Suitable piezoelectric thin films include polyvinylidene difluoride ($PVF_2$) and teflon.

A suitable control circuit for generating, receiving, and analyzing the acoustic waves is shown in FIG. 7. For generating the acoustic waves a pulse generator 60 directs a signal through a signal amplifier 62 to the transducer 36. As shown in FIG. 8 the transducer 36 may include a piezoelectric film 64 mounted to the wafer carrier 20. The piezoelectric film 64 which functions as the driver can be placed between the wafer carrier pad 26 (which contacts the back side of the wafer 10) and the wafer carrier 20. As an example the driver piezoelectric film 64 can be very thin, (i.e. on the order of 1 um or less) and function as previously explained to convert a voltage to an acoustic wave. An opening 66 through the wafer carrier can be used for placing conducting wires 68 which make contact between the driver piezoelectric film 64 and outside devices such as the signal amplifier 62 and the pulse generator 60.

In a similar manner a detector piezoelectric film 70 is mounted to the wafer carrier 20 for detecting the reflected acoustic waves from the wafer 10 and converting the reflected acoustic waves to a voltage. Conducting wires 72 placed through an opening 74 in the wafer carrier 20 connect the detector piezoelectric film 70 to a low noise amplifier 76 (FIG. 7). As also shown in FIG. 7 a lock-in amplifier 78 coordinates the signals generated by the pulse generator 60 and received by the receiver 38. A computer 80 analyzes the different signals and can use this information to develop a thickness map or a similar criteria for evaluating the characteristics of the wafer 10 during the (CMP) process. This information can then be used, as denoted by block 82, to adjust the CMP parameters as required.

As an alternative to analyzing the acoustic waves with a timed sequence, an acoustic phase technique can be utilized. In the case of a phase analysis, the phase of the reflected waves from the substrate 52 and the film 54 interfaces can be measured and compared with theoretical phase calculations. For this analysis, the acoustic velocity of the film as well as the acoustic impedances of the wafer substrate and film are required.

Among the advantages of the present method and apparatus are the following:

1. The thickness or end point of a film being planarized or removed can be continuously monitored during the (CMP) process and the uniformity of the process can be controlled.

2. While polishing multi-layered or stacked films, the transition from one film can be monitored because the acoustical velocity and acoustical absorption will vary with different film materials.

3. (CMP) processes can be improved and production throughput can be increased.

4. The uniformity or planarity of a planarized film can be detected by measuring film thickness at several sites on the wafer.

The method of the invention thus provides a simple yet non-obvious method and apparatus for performing chemical mechanical planarization (CMP) of a semiconductor wafer and for controlling the (CMP) process in real time. While the method and apparatus of the invention has been described with reference to a preferred embodiment thereof, as will be apparent to those skilled in the art, certain changes and modifications can be made without departing from the scope of the invention as defined by the following claims.

What is claimed is:

1. A method of chemical mechanical planarization (CMP) comprising:
   planarizing a semiconductor wafer on a rotating polishing platen;
   directing acoustic waves at the wafer during planarization;
   receiving reflected acoustic waves from the wafer;
   analyzing the acoustic waves and reflected acoustic waves to determine a thickness of the wafer by analyzing a round trip time of acoustic waves directed at the wafer and reflected from the wafer by the formula $x = V(T1-T2)/2$ where V is an acoustic velocity through the wafer and (T1-T2) is a round trip time of the acoustic waves;
   controlling planarizing of the wafer in response to analysis of the acoustic waves.

2. A method of chemical mechanical planarization (CMP) comprising:
   planarizing a semiconductor wafer on a rotating polishing platen;
   directing acoustic waves at the wafer during planarization;
   receiving reflected acoustic waves from the wafer;
   analyzing the acoustic waves and reflected acoustic waves to determined a thickness of a film removed from the wafer by determining a polish rate and multiplying the polish rate by a polishing time; and
   controlling planarizing of the wafer in response to analysis of the acoustic waves.

3. The method as recited in claim 2 and wherein:
   a thickness of the wafer is measured at several sites on the wafer for determining a uniformity of the CMP process.

4. A method of chemical mechanical planarization (CMP) comprising:
   planarizing a semiconductor wafer having a plurality of stacked films on a rotating polishing platen;
   directing acoustic waves at the wafer during planarization;
   receiving reflected acoustic waves from the wafer;
   analyzing the acoustic waves and reflected acoustic waves to determine a transition from one film to another film; and
   controlling planarizing of the wafer in response to analysis of the acoustic waves.

5. A method of chemical mechanical planarization (CMP) for a semiconductor wafer comprising:
   planarizing the wafer by holding and rotating the wafer in a wafer carrier against a rotating polishing platen in the presence of a polishing slurry;
   directing acoustic waves generated by a transducer having a piezoelectric film and mounted in the wafer carrier at a backside of the wafer:
   receiving reflected acoustic waves reflected from the wafer with a receiver having a piezoelectric film and mounted in the wafer carrier;
   analyzing the acoustic waves and the reflected acoustic waves to determine a thickness of the wafer and a thickness of a film formed on the wafer; and
   adjusting parameters associated with planarizing the wafer in response to the analysis of the acoustic waves and reflected acoustic waves.

6. A method of chemical mechanical planarization (CMP) for a semiconductor wafer comprising:
   planarizing the wafer by holding and rotating the wafer in a wafer carrier against a rotating polishing platen in the presence of a polishing slurry;
   directing acoustic waves generated by a transducer at the wafer;
   receiving reflected acoustic waves reflected from the wafer with a receiver;
   analyzing the acoustic waves and the reflected acoustic waves to determine a thickness of the wafer and a thickness of a film formed on the wafer; and
   adjusting parameters associated with planarizing the wafer in response to the analysis of the acoustic waves and reflected acoustic waves and wherein the transducer includes a driver piezoelectric film for converting voltage pulses to acoustic waves and the receiver includes a detector piezoelectric film for converting acoustic waves to a voltage.

7. The method as defined in claim 6 and wherein:
   a thickness of the wafer and the film are determined by analyzing the acoustic waves and reflected acoustic waves and using the formula $x = V(T1-T2)/2$ where V = a weighted average of the acoustic velocity through the wafer and through the film and T1-T2 = a round trip time of an acoustic wave launched from the transducer and received by the receiver.

8. The method as defined in claim 6 and wherein:
   film thicknesses are detected at several sites on the wafer to determine a planarity of the film during the planarizing process.

9. The method as defined in claim 5 and wherein:
   a thickness of the film is determined, with an acoustic phase analysis, by measuring the phase of reflected acoustic waves and comparing the phase with theoretical phase calculations.

10. The method as defined in claim 6 and wherein:
    a thickness of the film removed from the wafer is determined using a polish rate multiplied by a polish time.

* * * * *